US010930773B2

(12) United States Patent
Kono et al.

(10) Patent No.: US 10,930,773 B2
(45) Date of Patent: Feb. 23, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hiroshi Kono, Himeji Hyogo (JP); Teruyuki Ohashi, Kawasaki Kanagawa (JP); Masaru Furukawa, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/559,015

(22) Filed: Sep. 3, 2019

(65) Prior Publication Data

US 2020/0279940 A1 Sep. 3, 2020

(30) Foreign Application Priority Data

Mar. 1, 2019 (JP) .................................. 2019-038034

(51) Int. Cl.
*H01L 29/78* (2006.01)
*H01L 29/08* (2006.01)
(Continued)

(52) U.S. Cl.
CPC ...... *H01L 29/7804* (2013.01); *H01L 29/0865* (2013.01); *H01L 29/0882* (2013.01);
(Continued)

(58) Field of Classification Search
CPC . H01L 29/7804; H01L 29/1608; H01L 29/36; H01L 29/7813; H01L 29/7806;
(Continued)

(56) References Cited

U.S. PATENT DOCUMENTS 9,786,778 B1 * 10/2017 Morizuka ........... H01L 29/1608
2012/0153303 A1 6/2012 Uchida
(Continued)

FOREIGN PATENT DOCUMENTS

JP 2009-266871 A 11/2009
JP 5739813 B2 6/2015
(Continued)

*Primary Examiner* — Thinh T Nguyen
(74) *Attorney, Agent, or Firm* — White & Case LLP

(57) ABSTRACT

A semiconductor device according to an embodiment includes first electrode; second electrode; silicon carbide layer between the first electrode and the second electrode, the silicon carbide layer having first and second plane, the silicon carbide layer including first silicon carbide region of first-conductivity-type, second silicon carbide region and third silicon carbide region between the first silicon carbide region and the first plane, fourth silicon carbide region between the second silicon carbide region and the first plane, the fourth silicon carbide region contacting the first electrode, fifth silicon carbide region between the second silicon carbide region and the third silicon carbide region, the fifth silicon carbide region having a higher first-conductivity-type impurity concentration than the first silicon carbide region, sixth silicon carbide region between the fifth silicon carbide region and the first plane, the sixth silicon carbide region contacting the first electrode; gate electrode facing the second silicon carbide region.

14 Claims, 10 Drawing Sheets

(51) Int. Cl.
   *H01L 29/16* (2006.01)
   *H01L 29/36* (2006.01)
   *H01L 29/10* (2006.01)
   *H01L 29/423* (2006.01)
   *H01L 29/165* (2006.01)
   *H01L 29/872* (2006.01)

(52) U.S. Cl.
   CPC ...... *H01L 29/1033* (2013.01); *H01L 29/1095* (2013.01); *H01L 29/1608* (2013.01); *H01L 29/36* (2013.01); *H01L 29/4236* (2013.01); *H01L 29/7806* (2013.01); *H01L 29/7813* (2013.01); *H01L 29/165* (2013.01); *H01L 29/872* (2013.01)

(58) Field of Classification Search
   CPC ............. H01L 29/0865; H01L 29/0882; H01L 29/1033
   USPC ........................... 257/77, 329; 438/105, 268
   See application file for complete search history.

(56) References Cited

U.S. PATENT DOCUMENTS

| | | |
|---|---|---|
| 2012/0223339 A1 | 9/2012 | Mizukami |
| 2019/0088775 A1 | 3/2019 | Furukawa |

FOREIGN PATENT DOCUMENTS

| | | |
|---|---|---|
| JP | 5745974 B2 | 7/2015 |
| JP | 2019-54195 A | 4/2019 |
| WO | 2011-027540 A1 | 3/2011 |

* cited by examiner

SEMICONDUCTOR DEVICE

CROSS-REFERENCE TO RELATED APPLICATION

This application is based upon and claims the benefit of priority from Japanese Patent Application No. 2019-038034, filed on Mar. 1, 2019, the entire contents of which are incorporated herein by reference.

FIELD

Embodiments described herein relate generally to a semiconductor device.

BACKGROUND

Silicon carbide is expected as a material for the next-generation semiconductor devices. Silicon carbide has better physical properties than silicon. For example, the bandgap of the silicon carbide is three times wider than that of silicon, the breakdown field strength of the silicon carbide is about ten times higher than that of silicon, and the thermal conductivity of the silicon carbide is about three times higher than that of silicon. The use of the physical properties makes it possible to achieve a metal oxide semiconductor field effect transistor (MOSFET) that has a high breakdown voltage and low loss and can operate at a high temperature.

A vertical MOSFET using silicon carbide has a pn junction diode (body diode) as an embedded diode. For example, the MOSFET is used as a switching element connected to an inductive load. In this case, even though the MOSFET is turned off, a reflux current can flow by the use of the body diode.

However, in a case in which a reflux current flows by the use of the body diode that performs bipolar operation, there is a problem that a stacking fault is grown in a silicon carbide layer by carrier recombination energy and the on-resistance of the MOSFET increases. The increase in the on-resistance of the MOSFET leads to degaradation in the reliability of the MOSFET.

For example, a Schottky barrier diode (SBD) that performs a unipolar operation is provided as the embedded diode in the MOSFET to suppress the occurrence of the stacking fault in the silicon carbide layer. In a case in which the SBD is provided in the MOSFET, the formation of the SBD hinders the scaling-down of the MOSFET. As a result, there is a concern that the on-resistance of the MOSFET will increase.

DETAILED DESCRIPTION

Figure 1:
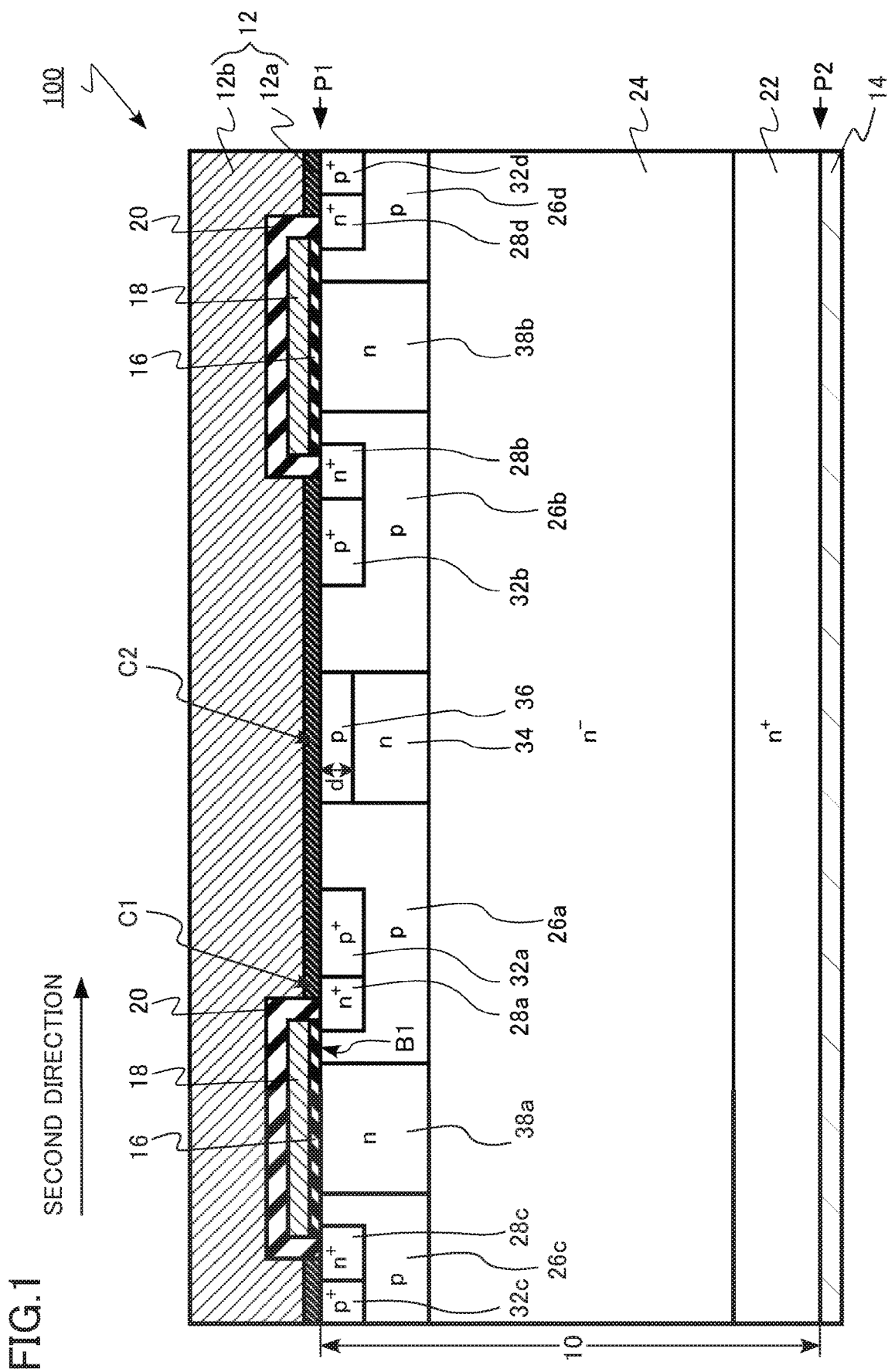
FIG. 1 is a cross-sectional view schematically illustrating a semiconductor device according to a first embodiment.

A semiconductor device according to an embodiment includes a first electrode; a second electrode; a silicon carbide layer provided between the first electrode and the second electrode, the silicon carbide layer having a first plane on a first electrode side and a second plane on a second electrode side, the silicon carbide layer including first silicon carbide region of first-conductivity-type, a second silicon carbide region of second-conductivity-type, a third silicon carbide region of second-conductivity-type, a fourth silicon carbide region of first-conductivity-type, a fifth silicon carbide region of first-conductivity-type, and a sixth silicon carbide region of second-conductivity-type, the second silicon carbide region being provided between the first silicon carbide region and the first plane, the third silicon carbide region being provided between the first silicon carbide region and the first plane, the third silicon carbide region being separated from the second silicon carbide region, the fourth silicon carbide region being provided between the second silicon carbide region and the first plane, the fourth silicon carbide region contacting the first electrode, the fifth silicon carbide region being provided between the second silicon carbide region and the third silicon carbide region, the fifth silicon carbide region having a higher first-conductivity-type impurity concentration than the first silicon carbide region, the sixth silicon carbide region being provided between the fifth silicon carbide region and the first plane, the sixth silicon carbide region contacting the first electrode; a gate electrode facing the second silicon carbide region; and a gate insulating layer provided between the gate electrode and the second silicon carbide region.

Hereinafter, embodiments of the invention will be described with reference to the drawings. In the following description, in some cases, the same or similar members are denoted by the same reference numerals and the description of, for example, the member which has been described once will not be repeated.

In the following description, in a case in which the notation of $n^+$, $n$, $n^-$, $p^+$, $p$, and $p^-$ is used, this notation indicates the relative impurity concentration levels of each conductivity type. That is, $n^+$ indicates a higher n-type impurity concentration than n and $n^-$ indicates a lower n-type impurity concentration than n. In addition, $p^+$ indicates a higher p-type impurity concentration than p and $p^-$ indicates a lower p-type impurity concentration than p. In some cases, an $n^+$ type and an $n^-$ type are simply referred to as an n type and a $p^+$ type and a $p^-$ type are simply referred to as a p type.

In the specification, it is assumed that "impurity concentration" means concentration that compensates for the concentration of impurities of an opposite conductivity type unless otherwise noted. That is, the n-type impurity concentration of an n-type silicon carbide region means concentration obtained by subtracting p-type impurity concentration from n-type impurity concentration. In addition, the p-type impurity concentration of a p-type silicon carbide region means concentration obtained by subtracting n-type impurity concentration from p-type impurity concentration.

The impurity concentration can be measured by, for example, time-of-flight secondary ion mass spectrometry (TOF-SIMS). In addition, the relative impurity concentration level can be determined from a carrier concentration level calculated by, for example, scanning capacitance microscopy (SCM). A distance, such as the depth or thickness of an impurity region, can be calculated by, for example, TOF-SIMS. Further, a distance, such as the depth, thickness, width, or interval of impurity regions, can be calculated from, for example, a composite image of an SCM image and an atomic force microscope (AFM) image.

First Embodiment

A semiconductor device according to a first embodiment includes a first electrode; a second electrode; a silicon carbide layer provided between the first electrode and the second electrode, the silicon carbide layer having a first plane on a first electrode side and a second plane on a second electrode side, the silicon carbide layer including a first-conductivity-type first silicon carbide region, a second-conductivity-type second silicon carbide region, a second-conductivity-type third silicon carbide region, a first-conductivity-type fourth silicon carbide region, a first-conductivity-type fifth silicon carbide region, and a second-conductivity-type sixth silicon carbide region, the second silicon carbide region being provided between the first silicon carbide region and the first plane, the third silicon carbide region being provided between the first silicon carbide region and the first plane, the third silicon carbide region being separated from the second silicon carbide region, the fourth silicon carbide region being provided between the second silicon carbide region and the first plane, the fourth silicon carbide region coming into contact with the first electrode, the fifth silicon carbide region being provided between the second silicon carbide region and the third silicon carbide region, the fifth silicon carbide region having a higher first-conductivity-type impurity concentration than the first silicon carbide region, the sixth silicon carbide region being provided between the fifth silicon carbide region and the first plane, the sixth silicon carbide region coming into contact with the first electrode; a gate electrode facing the second silicon carbide region; and a gate insulating layer provided between the gate electrode and the second silicon carbide region.

Figure 2:
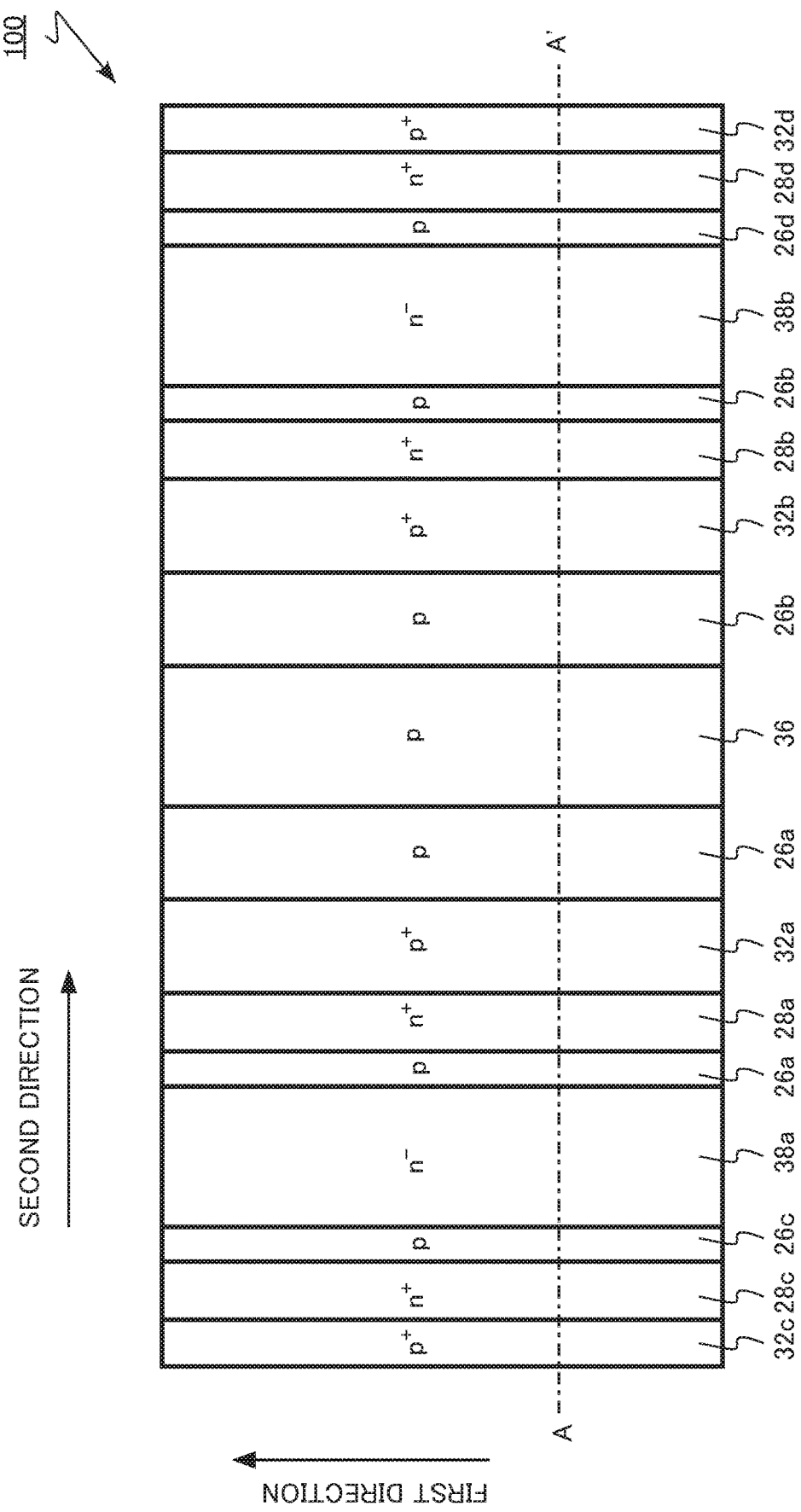
FIG. 2 is a top view schematically illustrating the semiconductor device according to the first embodiment.

FIG. 1 is a cross-sectional view schematically illustrating the semiconductor device according to the first embodiment. FIG. 2 is a top view schematically illustrating the semiconductor device according to the first embodiment. FIG. 2 illustrates a pattern of silicon carbide regions in a front surface of a silicon carbide layer. FIG. 1 is a cross-sectional view taken along the line AA' of FIG. 2.

The semiconductor device according to the first embodiment is a planar-gate-type vertical MOSFET 100 using silicon carbide. The MOSFET 100 according to the first embodiment is, for example, a double implantation MOSFET (DIMOSFET) in which a body region and a source region are formed by ion implantation. In addition, the semiconductor device according to the first embodiment includes an SBD as an embedded diode.

Hereinafter, a case in which a first conductivity type is an n type and a second conductivity type is a p type will be described as an example. The MOSFET 100 is a vertical n-channel MOSFET having electrons as carriers.

The MOSFET 100 includes a silicon carbide layer 10, a source electrode 12 (first electrode), a drain electrode 14 (second electrode), a gate insulating layer 16, a gate electrode 18, and an interlayer insulating layer 20.

The silicon carbide layer 10 includes an $n^+$ drain region 22, an $n^-$ drift region 24 (first silicon carbide region), a p-type first body region 26a (second silicon carbide region), a p-type second body region 26b (third silicon carbide region), a p-type third body region 26c, a p-type fourth body region 26d, an $n^+$ first source region 28a (fourth silicon carbide region), an $n^+$ second source region 28b, an $n^+$ third source region 28c, an $n^+$ fourth source region 28d, a $p^+$ first body contact region 32a (tenth silicon carbide region), a $p^+$ second body contact region 32b, a $p^+$ third body contact region 32c, a $p^+$ fourth body contact region 32d, an n-type n barrier region 34 (fifth silicon carbide region), a p-type p barrier region 36 (sixth silicon carbide region), an n-type first JFET region 38a, and an n-type second JFET region 38b.

The silicon carbide layer 10 is provided between the source electrode 12 and the drain electrode 14. The silicon carbide layer 10 is made of single-crystal SiC. The silicon carbide layer 10 is made of, for example, 4H-SiC.

The silicon carbide layer 10 has a first plane ("P1" in FIG. 1) and a second plane ("P2" in FIG. 1). Hereinafter, in some cases, the first plane is referred to as a front surface and the second plane is referred to as a rear surface. The first plane P1 is located on the side of the source electrode 12 of the silicon carbide layer 10. In addition, the second plane P2 is located on the side of the drain electrode 14 of the silicon carbide layer 10. Hereinafter, a "depth" means a depth from the first plane in a direction toward the second plane.

The first plane P1 is, for example, a plane which is inclined at an angle that is equal to or greater than 0 degrees and equal to or less than 8 degrees with respect to the (0001) face. In addition, the second plane P2 is, for example, a plane which is inclined at an angle that is equal to or greater than 0 degrees and equal to or less than 8 degrees with respect to the (000-1) face. The (0001) face is referred to as a silicon plane. The (000-1) face is referred to as a carbon face.

The $n^+$ drain region 22 is provided on the side of the rear surface of the silicon carbide layer 10. The drain region 22 includes, for example, nitrogen (N) as n-type impurities. The n-type impurity concentration of the drain region 22 is, for example, equal to or greater than $1 \times 10^{18}$ cm$^{-3}$ and equal to or less than $1 \times 10^{21}$ cm$^{-3}$.

The $n^-$ drift region 24 is provided between the drain region 22 and the first plane P1. The $n^-$ drift region 24 is provided between the source electrode 12 and the drain electrode 14. The $n^-$ drift region 24 is provided between the gate electrode 18 and the drain electrode 14.

The $n^-$ drift region 24 is provided on the drain region 22. The drift region 24 includes, for example, nitrogen (N) as n-type impurities. The n-type impurity concentration of the drift region 24 is lower than the n-type impurity concentration of the drain region 22. The n-type impurity concentration of the drift region 24 is, for example, equal to or greater than $4 \times 10^{14}$ cm$^{-3}$ and equal to or less than $1 \times 10^{17}$ cm$^{-3}$. The thickness of the drift region 24 is, for example, equal to or greater than 5 μm and equal to or less than 150 μm.

The p-type first body region 26a, the p-type second body region 26b, the p-type third body region 26c, and the p-type fourth body region 26d are provided between the drift region 24 and the first plane P1. The first body region 26a, the second body region 26b, the third body region 26c, and the fourth body region 26d are separated from each other. The first body region 26a, the second body region 26b, the third body region 26c, and the fourth body region 26d extend in the first direction.

The first body region 26a, the second body region 26b, the third body region 26c, and the fourth body region 26d function as channel regions of the MOSFET 100.

The first body region 26a, the second body region 26b, the third body region 26c, and the fourth body region 26d include, for example, aluminum (Al) as p-type impurities. The p-type impurity concentration of the first body region 26a, the second body region 26b, the third body region 26c, and the fourth body region 26d is, for example, equal to or greater than $5 \times 10^{17}$ cm$^{-3}$ and equal to or less than $5 \times 10^{19}$ cm$^{-3}$.

The depth of the first body region 26a, the second body region 26b, the third body region 26c, and the fourth body region 26d is, for example, equal to or greater than 0.5 μm and equal to or less than 1.0 μm.

The first body region 26a, the second body region 26b, the third body region 26c, and the fourth body region 26d are fixed to the potential of the source electrode 12.

A portion ("B1" in FIG. 1) of the first body region 26a comes into contact with the first plane P1. The portion B1 of the first body region 26a faces the gate electrode 18. A portion of the first body region 26a which faces the gate electrode 18 is a channel region of the MOSFET 100.

The p-type impurity concentration of the channel region which is a portion of the first body region 26a is lower than, for example, the p-type impurity concentration of a portion of the first body region 26a which is close to the second plane P2 and is a channel region. The p-type impurity concentration of the channel region is, for example, equal to or greater than $1 \times 10^{16}$ cm$^{-3}$ and equal to or less than $5 \times 10^{17}$ cm$^{-3}$.

The n$^+$ first source region 28a is provided between the first body region 26a and the first plane P1. The n$^+$ second source region 28b is provided between the second body region 26b and the first plane P1. The n$^+$ third source region 28c is provided between the third body region 26c and the first plane P1. The n$^+$ fourth source region 28d is provided between the fourth body region 26d and the first plane P1. The first source region 28a, the second source region 28b, the third source region 28c, and the fourth source region 28d extend in the first direction.

The first source region 28a, the second source region 28b, the third source region 28c, and the fourth source region 28d include, for example, phosphorus (P) as n-type impurities. The n-type impurity concentration of the first source region 28a, the second source region 28b, the third source region 28c, and the fourth source region 28d is higher than the n-type impurity concentration of the drift region 24.

The n-type impurity concentration of the first source region 28a, the second source region 28b, the third source region 28c, and the fourth source region 28d is, for example, equal to or greater than $1 \times 10^{19}$ cm$^{-3}$ and equal to or less than $1 \times 10^{21}$ cm$^{-3}$. The depth of the first source region 28a, the second source region 28b, the third source region 28c, and the fourth source region 28d is less than the depth of the first body region 26a, the second body region 26b, the third body region 26c, and the fourth body region 26d and is, for example, equal to or greater than 0.1 μm and equal to or less than 0.3 μm.

The first source region 28a, the second source region 28b, the third source region 28c, and the fourth source region 28d come into contact with the source electrode 12. The contact between the first source region 28a, the second source region 28b, the third source region 28c, and the fourth source region 28d and the source electrode 12 is, for example, an ohmic contact.

The first source region 28a, the second source region 28b, the third source region 28c, and the fourth source region 28d are fixed to the potential of the source electrode 12.

The p$^+$ first body contact region 32a is provided between the first body region 26a and the first plane P1. The p$^+$ second body contact region 32b is provided between the second body region 26b and the first plane P1. The p$^+$ third body contact region 32c is provided between the third body region 26c and the first plane P1. The p$^+$ fourth body contact region 32d is provided between the fourth body region 26d and the first plane P1. The first body contact region 32a, the second body contact region 32b, the third body contact region 32c, and the fourth body contact region 32d extend in the first direction.

The p-type impurity concentration of the first body contact region 32a, the second body contact region 32b, the third body contact region 32c, and the fourth body contact region 32d is higher than the p-type impurity concentration of the first body region 26a, the second body region 26b, the third body region 26c, and the fourth body region 26d.

The first body contact region 32a, the second body contact region 32b, the third body contact region 32c, and the fourth body contact region 32d include, for example, aluminum (Al) as p-type impurities. The p-type impurity concentration of the first body contact region 32a, the second body contact region 32b, the third body contact region 32c, and the fourth body contact region 32d is, for example, equal to or greater than $1 \times 10^{19}$ cm$^{-3}$ and equal to or less than $1 \times 10^{21}$ cm$^{-3}$.

The depth of the first body contact region 32a, the second body contact region 32b, the third body contact region 32c, and the fourth body contact region 32d is, for example, equal to or greater than 0.3 μm and equal to or less than 0.6 μm.

The first body contact region 32a, the second body contact region 32b, the third body contact region 32c, and the fourth body contact region 32d come into contact with the source electrode 12.

The n barrier region 34 is provided between the first body region 26a and the second body region 26b. The n barrier region 34 is provided between the drift region 24 and the first plane P1. The n barrier region 34 extends in the first direction.

The n barrier region 34 includes, for example, nitrogen (N) as n-type impurities. The n-type impurity concentration of the n barrier region 34 is higher than, for example, the n-type impurity concentration of the drift region 24.

The n-type impurity concentration of the n barrier region 34 is, for example, equal to or greater than $5 \times 10^{16}$ cm$^{-3}$ and equal to or less than $2 \times 10^{17}$ cm$^3$.

The p barrier region 36 is provided between the n barrier region 34 and the first plane P1. The p barrier region 36 is provided between the first body region 26a and the second body region 26b. The p barrier region 36 extends in the first direction.

The p barrier region 36 comes into contact with the source electrode 12. The junction between the p barrier region 36 and the source electrode 12 is a Schottky junction.

The p barrier region 36 includes, for example, aluminum (Al) as p-type impurities. The p-type impurity concentration of the p barrier region 36 is, for example, equal to or greater than $1 \times 10^{17}$ cm$^{-3}$ and equal to or less than $2 \times 10^{18}$ cm$^{-3}$.

The p-type impurity concentration of the p barrier region 36 is higher than, for example, the p-type impurity concentration of a portion of the first body region 26a which faces the gate electrode 18. In other words, the p-type impurity concentration of the p barrier region 36 is higher than, for example, the p-type impurity concentration of the channel region of the MOSFET 100.

The distance ("d" in FIG. 1) of the boundary between the n barrier region 34 and the p barrier region 36 from the first plane P1 is, for example, equal to or greater than 50 nm and equal to or less than 200 nm. In other words, the depth of the p barrier region 36 is, for example, equal to or greater than 50 nm and equal to or less than 200 nm. Since the n barrier region 34 having a higher n-type impurity concentration than the drift region 24 is provided, it is possible to reduce the depth of the p barrier region 36.

The source electrode 12, the p barrier region 36, the n barrier region 34, and the drift region 24 form an SBD. The source electrode 12 functions as an anode of the SBD and the p barrier region 36, the n barrier region 34, and the drift region 24 function as a cathode of the SBD.

The n-type first JFET region 38a is provided between the first body region 26a and the third body region 26c. The first JFET region 38a is provided between the drift region 24 and the first plane P1. The first JFET region 38a extends in the first direction.

The n-type second JFET region 38b is provided between the second body region 26b and the fourth body region 26d. The second JFET region 38b is provided between the drift region 24 and the first plane P1. The second JFET region 38b extends in the first direction.

In a case in which the MOSFET 100 is in an on state, for example, electrons flow from the source electrode 12 to the drain electrode 14 through the first source region 28a, the channel formed in the first body region 26a, the first JFET region 38a, the drift region 24, and the drain region 22.

The first JFET region 38a and the second JFET region 38b include, for example, nitrogen (N) as n-type impurities. The n-type impurity concentration of the first JFET region 38a and the second JFET region 38b is higher than, for example, the n-type impurity concentration of the drift region 24.

The n-type impurity concentration of the first JFET region 38a and the second JFET region 38b is, for example, equal to or greater than $5 \times 10^{16}$ cm$^{-3}$ and equal to or less than $2 \times 10^{17}$ cm$^{-3}$.

The gate electrode 18 is provided on the side of the first plane P1 of the silicon carbide layer 10. The gate electrode 18 extends in the first direction. A plurality of gate electrodes 18 are arranged in parallel to each other in the second direction perpendicular to the first direction.

The gate electrode 18 is a conductive layer. The gate electrode 18 is made of, for example, polycrystalline silicon including p-type impurities or n-type impurities.

The gate electrode 18 faces, for example, the portion B1 of the first body region 26a which comes into contact with the first plane P1.

The gate insulating layer 16 is provided between the gate electrode 18 and the first to fourth body regions 26a to 26d. The gate insulating layer 16 is provided between the gate electrode 18 and the first and second JFET regions 38a and 38b. The gate insulating layer 16 is provided between the gate electrode 18 and the first to fourth source regions 28a to 28d.

The gate insulating layer 16 is provided, for example, between the portion B1 of the first body region 26a which comes into contact with the first plane P1 and the gate electrode 18.

The gate insulating layer 16 is made of, for example, silicon oxide. For example, a high-k insulating material (high-dielectric-constant insulating material) can be applied to the gate insulating layer 16.

The interlayer insulating layer 20 is provided on the gate electrode 18 and on the silicon carbide layer 10. The interlayer insulating layer 20 is made of, for example, silicon oxide.

The source electrode 12 comes into contact with the silicon carbide layer 10. The source electrode 12 comes into contact with the first source region 28a, the second source region 28b, the third source region 28c, and the fourth source region 28d. The source electrode 12 comes into contact with the p barrier region 36. The source electrode 12 comes into contact with the first body contact region 32a, the second body contact region 32b, the third body contact region 32c, and the fourth body contact region 32d.

The source electrode 12 includes a silicide layer 12a and a metal layer 12b. A portion of the source electrode 12 which comes into contact with the silicon carbide layer 10 is the silicide layer 12a.

The silicide layer 12a comes into contact with the first source region 28a, the second source region 28b, the third source region 28c, and the fourth source region 28d. The silicide layer 12a comes into contact with the p barrier region 36. The silicide layer 12a comes into contact with the first body contact region 32a, the second body contact region 32b, the third body contact region 32c, and the fourth body contact region 32d.

A first portion ("C1" in FIG. 1) in which the source electrode 12 comes into contact with the first source region 28a and a second portion ("C2" in FIG. 1) in which the source electrode 12 comes into contact with the p barrier region 36 are made of the same material. Both the first portion C1 and the second portion C2 are the silicide layer 12a.

The silicide layer 12a of the source electrode 12 includes silicide. The silicide layer 12a is made of, for example, nickel silicide or titanium silicide.

An ohmic contact is formed between the source electrode 12 and the first to fourth source regions 28a to 28d by providing the silicide layer 12a.

The metal layer 12b of the source electrode 12 includes metal. The metal layer 12b has, for example, a stacked structure of titanium (Ti) and aluminum (Al).

The drain electrode 14 is provided on the rear surface of the silicon carbide layer 10. The drain electrode 14 comes into contact with the drain region 22.

The drain electrode 14 is made of, for example, metal or a metal-semiconductor compound. For example, the drain electrode 14 includes at least one material selected from the group consisting of nickel silicide, titanium (Ti), nickel (Ni), silver (Ag), and gold (Au).

Next, the function and effect of the MOSFET 100 according to the first embodiment will be described.

Figure 3:
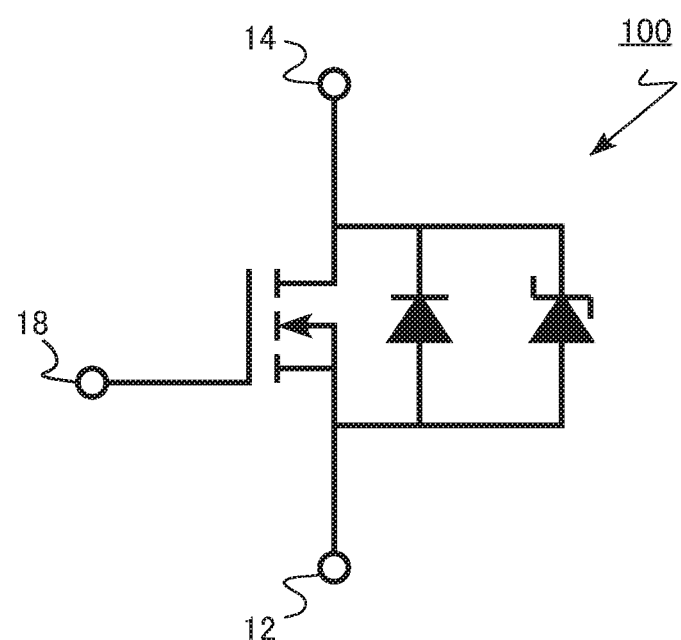
FIG. 3 is an equivalent circuit diagram illustrating the semiconductor device according to the first embodiment.

FIG. 3 is an equivalent circuit diagram illustrating the semiconductor device according to the first embodiment. The pn diode and the SBD are connected as embedded diodes in parallel to a transistor between the source electrode 12 and the drain electrode 14. The first body region 26a, the second body region 26b, the third body region 26c, and the fourth body region 26d are an anode of the pn junction diode and the drift region 24 is a cathode of the pn junction diode. In addition, the source electrode 12 is an anode of the SBD and the p barrier region 36, the n barrier region 34, and the drift region 24 are a cathode of the SBD.

For example, a case in which the MOSFET 100 is used as a switching element connected to an inductive load is considered. In a case in which the MOSFET 100 is turned off, a voltage at which the source electrode 12 is positive with respect to the drain electrode 14 is likely to be applied by a load current caused by the inductive load. In this case, a forward current flows to the embedded diode. This state is also referred to as a reverse conduction state.

A forward voltage (Vf) at which the forward current starts to flow to the SBD is lower than a forward voltage (Vf) of the pn junction diode. Therefore, first, a forward current flows to the SBD.

The forward voltage (Vf) of the SBD is, for example, equal to or greater than 1.0 V and equal to or less than 2.0 V. The forward voltage (Vf) of the pn junction diode is, for example, equal to or greater than 2.0 V and equal to or less than 3.0 V.

The SBD performs a unipolar operation. Therefore, even in a case in which a forward current flows, a stacking fault is not grown in the silicon carbide layer 10 by carrier recombination energy.

Figure 4:
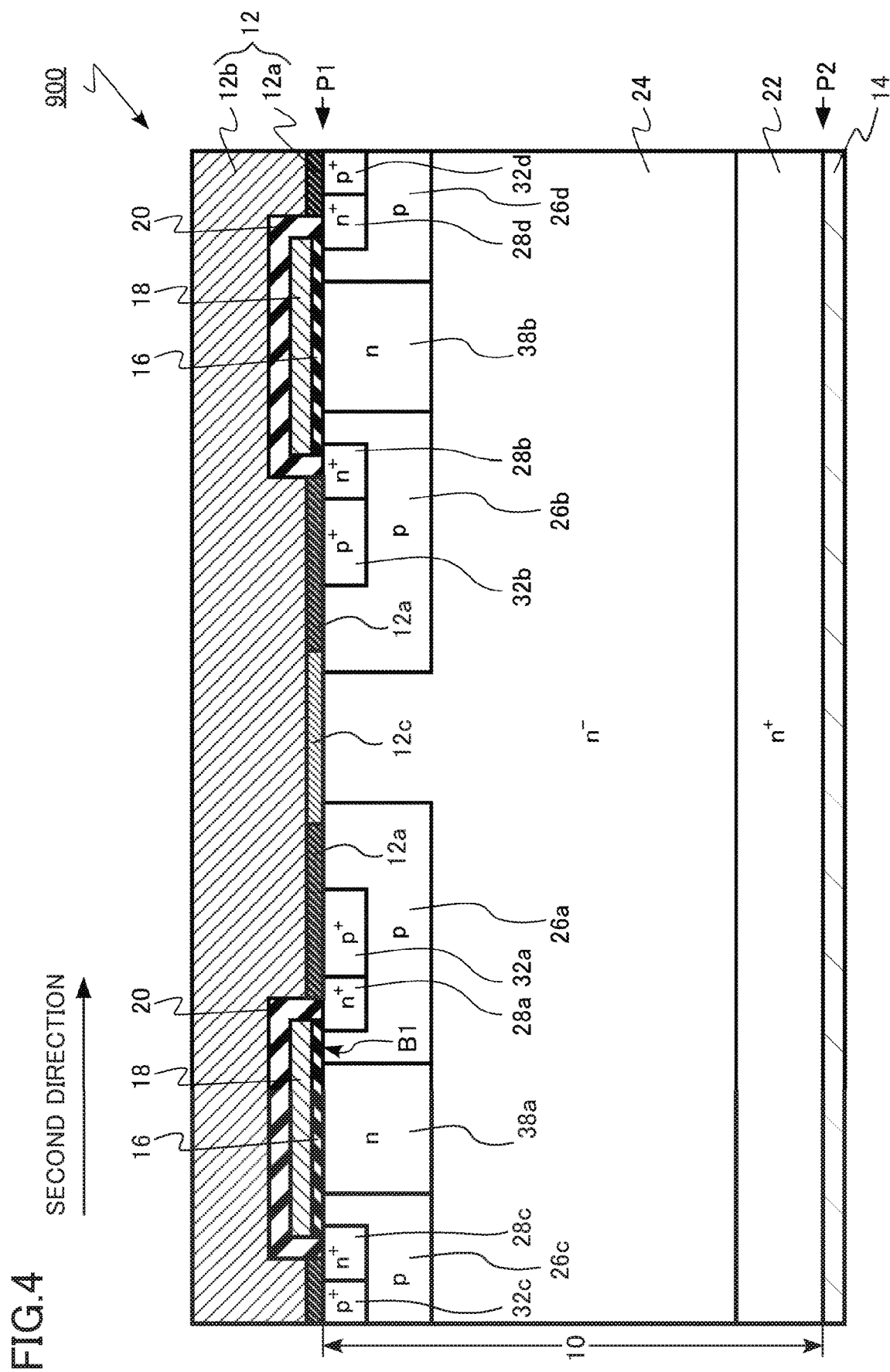
FIG. 4 is a diagram illustrating the function and effect of the semiconductor device according to the first embodiment.

FIG. 4 is a diagram illustrating the function and effect of the semiconductor device according to the first embodiment. FIG. 4 is a cross-sectional view schematically illustrating a MOSFET 900 according to a comparative example. FIG. 4 illustrates a cross section corresponding to FIG. 1 in the first embodiment.

The MOSFET 900 according to the comparative example differs from the MOSFET 100 according to the first embodiment in that a source electrode 12 includes a Schottky layer 12c in addition to the silicide layer 12a and the metal layer 12b and the MOSFET 900 does not include the n barrier region 34 and the p barrier region 36. The Schottky layer 12c comes into contact with the drift region 24.

The Schottky layer 12c is made of metal or a metal semiconductor compound. The Schottky layer 12c is made of, for example, titanium (Ti).

The Schottky layer 12c is made of a material different from that forming the silicide layer 12a. The Schottky layer 12c is made of, for example, a material that makes a Schottky barrier with respect to n-type silicon carbide higher than that of the silicide layer 12a.

A Schottky contact is formed between the source electrode 12 and the drift region 24 by providing the Schottky layer 12c. In a case in which a portion of the source electrode 12 which comes into contact with the drift region 24 is the silicide layer 12a, the Schottky barrier between the source electrode 12 and the drift region 24 may be too low and the source electrode 12 may not function as an SBD.

In the MOSFET 900 according to the comparative example, the Schottky layer 12c is provided to increase the Schottky barrier of the source electrode 12 with respect to n-type silicon carbide such that the source electrode 12 functions as an SBD.

However, in the MOSFET 900 according to the comparative example, the source electrode 12 is provided with the Schottky layer 12c in addition to the silicide layer 12a. Therefore, for example, in a case in which the silicide layer 12a or the Schottky layer 12c is patterned, an alignment margin with the drift region 24 is required. Therefore, it is difficult to scale down the MOSFET. In a case in which it is difficult to scale down the MOSFET, it is difficult to reduce the on-resistance of the MOSFET. In addition, a manufacturing process is complicated and a manufacturing cost increases.

In the MOSFET 100 according to the first embodiment, the Schottky layer 12c is not provided in the source electrode 12. Instead, the p barrier region 36 and the n barrier region 34 are provided.

The potential of electrons in the p barrier region 36 is increased to effectively increase the barrier with respect to electrons between the source electrode 12 and the n barrier region 34 such that the source electrode 12, the p barrier region 36, the n barrier region 34, and the drift region 24 function as an SBD having the source electrode 12 as an anode.

Therefore, according to the MOSFET 100 of the first embodiment, since the Schottky layer 12c is not provided, it is possible to scale down the MOSFET and to reduce the on-resistance of the MOSFET.

Figure 5A:
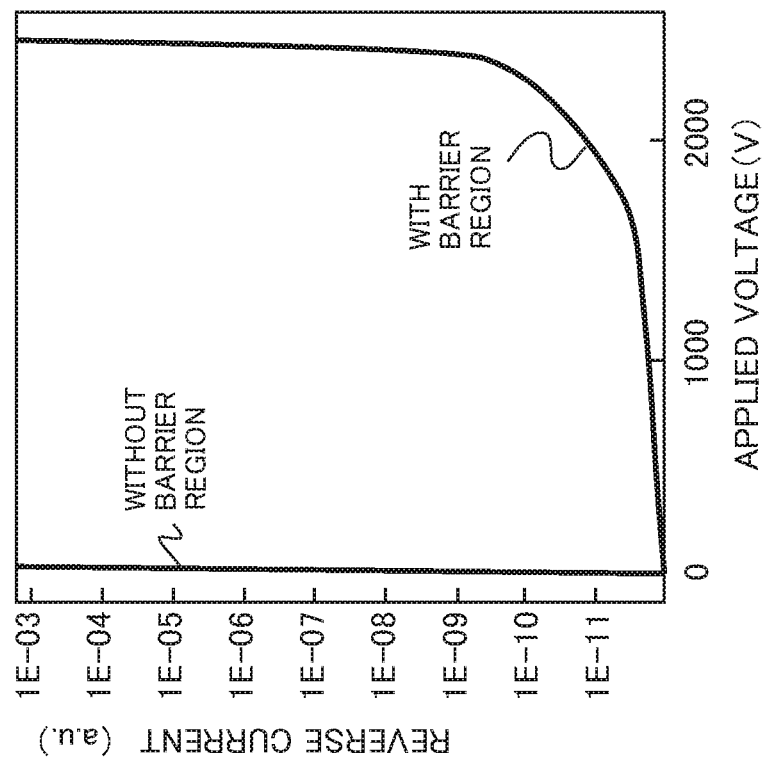
FIGS. 5A and 5B are diagrams illustrating the function and effect of the semiconductor device according to the first embodiment.
Figure 5B:
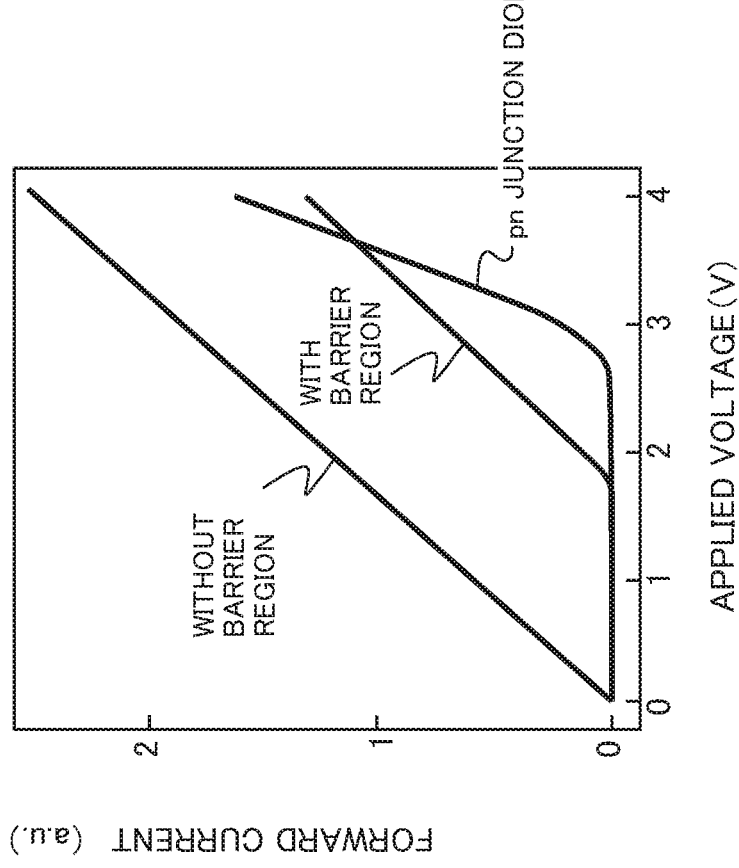

FIGS. 5A and 5B are diagrams illustrating the function and effect of the semiconductor device according to the first embodiment. FIG. 5A is a diagram illustrating the simulation results of the forward current-voltage characteristics of the diode. FIG. 5B is a diagram illustrating the simulation results of the reverse current-voltage characteristics of the diode.

FIG. 5A illustrates the simulation results of the SBD (with a barrier region) embedded in the MOSFET 100 according to the first embodiment, a case (without a barrier region) in which the p barrier region 36 and the n barrier region 34 are removed from the SBD embedded in the MOSFET 100, and a pn junction diode. FIG. 5B illustrates the simulation results of the SBD (with a barrier region) embedded in the MOSFET 100 according to the first embodiment and the case (without a barrier region) in which the p barrier region 36 and the n barrier region 34 are removed from the SBD embedded in the MOSFET 100.

As can be seen from FIG. 5A, in a case in which a barrier region is not provided, since a barrier height is too low, the forward current-voltage characteristics are linear characteristics. In contrast, in a case in which a barrier region is provided, a barrier height is high and the forward current-voltage characteristics are non-linear characteristics in which the forward voltage (Vf) rises at about 1.8 V. The forward voltage (Vf) of the SBD with a barrier region is lower than the forward voltage (Vf) of the pn junction diode.

As can be seen from FIG. 5B, in a case in which a barrier region is not provided, since a barrier height is too small, the reverse current-voltage characteristics are linear characteristics. In contrast, in a case in which a barrier region is provided, since a barrier height is high, the reverse current is suppressed. In other words, a reverse leakage current in a case in which the SBD is turned off is suppressed.

Figure 6:
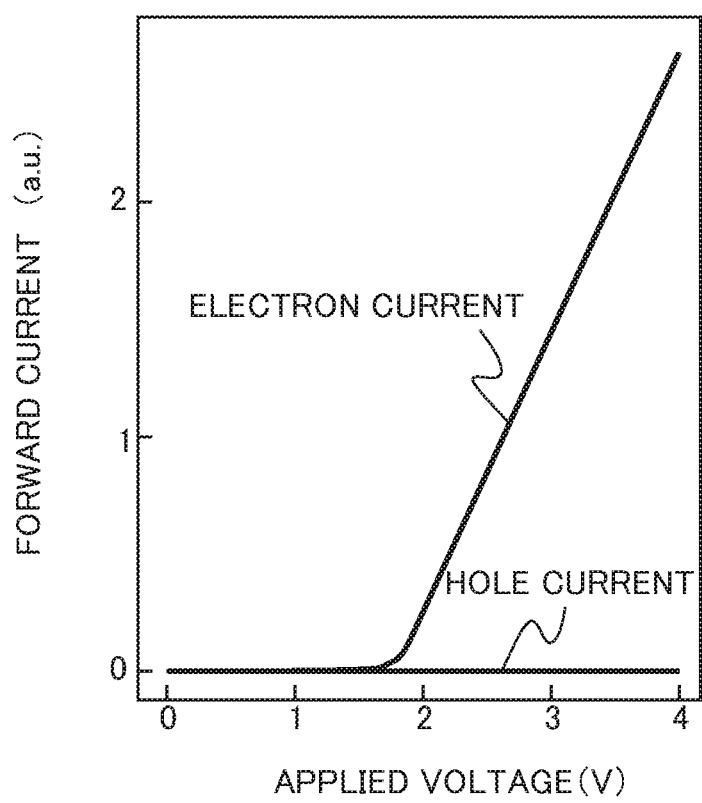
FIG. 6 is a diagram illustrating the function and effect of the semiconductor device according to the first embodiment.

FIG. 6 is a diagram illustrating the function and effect of the semiconductor device according to the first embodiment. FIG. 6 is a diagram illustrating the simulation results of the forward current-voltage characteristics of the SBD (with a barrier region) embedded in the MOSFET 100 according to the first embodiment. In FIG. 6, an electron current and a hole current are separately illustrated.

As can be seen from FIG. 6, in the SBD embedded in the MOSFET 100 according to the first embodiment, the hole current does not flow. Therefore, the SBD does not perform a bipolar operation, but performs a unipolar operation.

From the above, it is apparent that the SBD embedded in the MOSFET 100 according to the first embodiment performs the unipolar operation even though the SBD includes the p barrier region 36.

In a state in which no voltage is applied between the source electrode 12 and the drain electrode 14, that is, in a thermal equilibrium state, it is preferable that the p barrier region 36 is completely depleted. In a case in which the p barrier region 36 is not completely depleted, there is a concern that the SBD will perform the bipolar operation.

The p-type impurity concentration of the p barrier region 36 is preferably equal to or greater than $1 \times 10^{17}$ cm$^{-3}$ and equal to or less than $2 \times 10^{18}$ cm$^{-3}$ and more preferably equal to or greater than $5 \times 10^{17}$ cm$^{-3}$ and equal to or less than $1 \times 10^{18}$ cm$^{-3}$. In a case in which the p-type impurity concentration is greater than the lower limit, a sufficient barrier height is obtained by the p barrier region 36. In addition, in a case in which the p-type impurity concentration is less than the upper limit, the depletion of the p barrier region 36 progresses easily and the bipolar operation of the SBD is suppressed.

It is preferable that the p-type impurity concentration of the p barrier region 36 is higher than the p-type impurity concentration of a portion of the first body region 26a which faces the gate electrode 18 in order to obtain a sufficient barrier height using the p barrier region 36. That is, it is preferable that the p-type impurity concentration of the p barrier region 36 is higher than, for example, the p-type impurity concentration of the channel region of the MOSFET 100.

The distance d of the boundary between the n barrier region 34 and the p barrier region 36 from the first plane P1 is preferably equal to or greater than 50 nm and equal to or less than 200 nm and more preferably equal to or greater than 75 nm and equal to or less than 150 nm. In a case in which the distance d is greater than the lower limit, a sufficient barrier height is obtained by the p barrier region 36. In addition, in a case in which the distance d is less than the upper limit, the depletion of the p barrier region 36 progresses easily and the bipolar operation of the diode is suppressed.

It is preferable that the n-type impurity concentration of the first JFET region 38a is higher than the n-type impurity concentration of the n barrier region 34 in order to increase the on-resistance of the MOSFET 100. In contrast, it is preferable that the n-type impurity concentration of the first JFET region 38a is lower than the n-type impurity concentration of the n barrier region 34 in order to increase the breakdown voltage of the gate insulating layer 16.

As described above, according to the first embodiment, since the SBD is embedded in the MOSFET, the pn junction diode is unlikely to operate. Therefore, the growth of a stacking fault in the silicon carbide layer is suppressed and a MOSFET with high reliability is achieved. In addition, since the p barrier region 36 and the n barrier region 34 are provided, the layer structure of the source electrode 12 is simplified. Therefore, it is easy to scale down the MOSFET. As a result, it is possible to reduce the on-resistance of the MOSFET.

Second Embodiment

A semiconductor device according to a second embodiment differs from the semiconductor device according to the first embodiment in that a silicon carbide layer includes a second-conductivity-type seventh silicon carbide region which is provided between the fifth silicon carbide region and the first plane and between the sixth silicon carbide region and the second silicon carbide region, comes into contact with the first electrode, and has a lower second-conductivity-type impurity concentration than the sixth silicon carbide region. Hereinafter, the description of a portion of the same content as that in the first embodiment will not be repeated.

Figure 7:
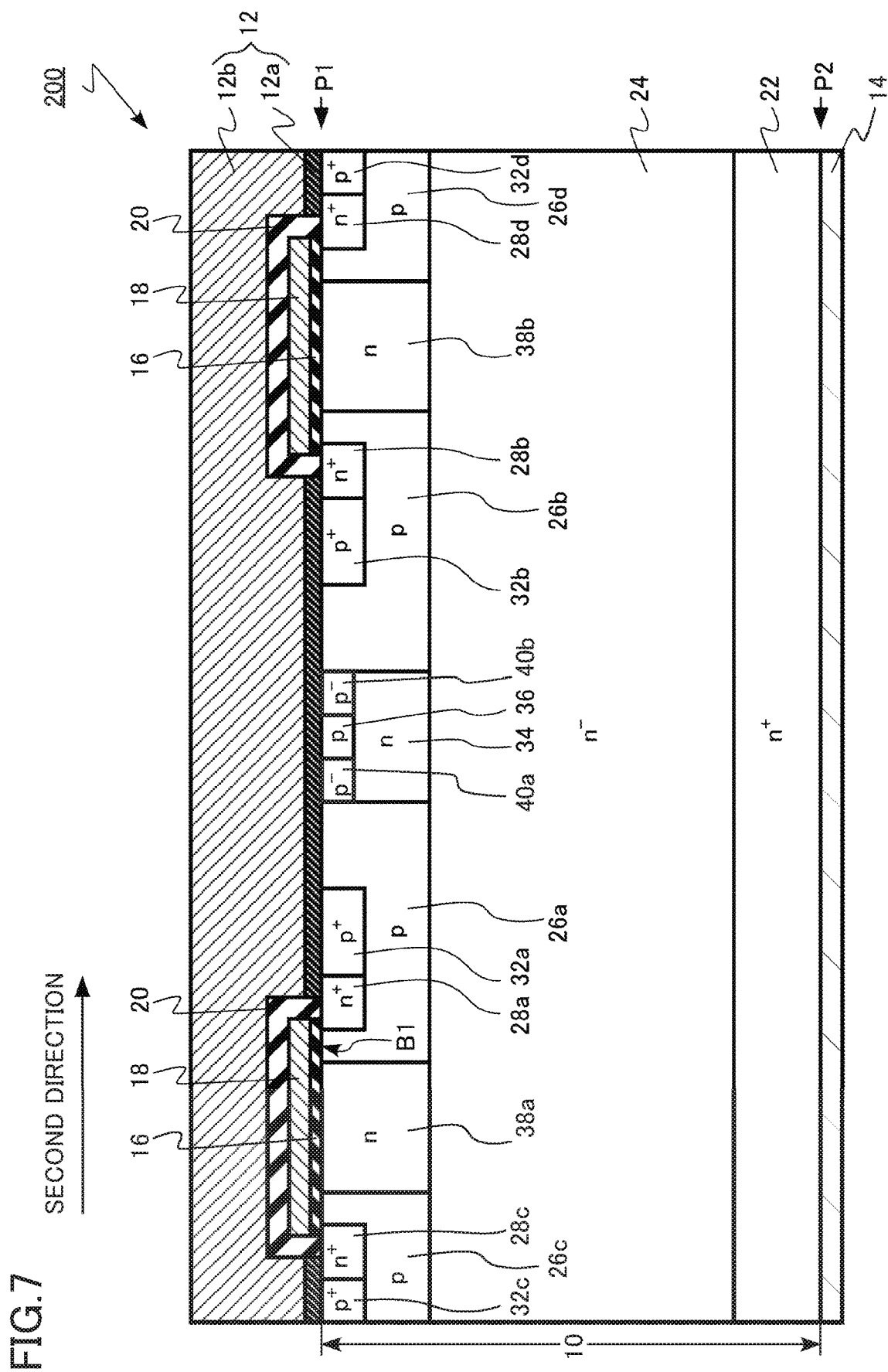
FIG. 7 is a cross-sectional view schematically illustrating a semiconductor device according to a second embodiment.

FIG. 7 is a cross-sectional view schematically illustrating the semiconductor device according to the second embodiment.

The semiconductor device according to the second embodiment is a planar-gate-type vertical MOSFET 200 using silicon carbide. The MOSFET 200 according to the second embodiment is, for example, a DIMOSFET in which a body region and a source region are formed by ion implantation. In addition, the semiconductor device according to the second embodiment includes an SBD as an embedded diode.

Hereinafter, a case in which the first conductivity type is an n type and the second conductivity type is a p type will be described as an example. The MOSFET 200 is a vertical n-channel MOSFET having electrons as carriers.

The MOSFET 200 includes a silicon carbide layer 10, a source electrode 12 (first electrode), a drain electrode 14 (second electrode), a gate insulating layer 16, a gate electrode 18, and an interlayer insulating layer 20.

The silicon carbide layer 10 includes a first low-concentration p barrier region 40a (seventh silicon carbide region) and a second low-concentration p barrier region 40b.

The first low-concentration p barrier region 40a is provided between an n barrier region 34 and a first plane P1. The first low-concentration p-type p barrier region 40a is provided between a p-type p barrier region 36 and a first body region 26a. The first low-concentration p-type p barrier region 40a extends in the first direction.

The p-type impurity concentration of the first low-concentration p barrier region 40a is lower than the p-type impurity concentration of the p barrier region 36. The p-type impurity concentration of the first low-concentration p barrier region 40a is, for example, equal to or less than half of the p-type impurity concentration of the p barrier region 36.

The first low-concentration p barrier region 40a includes, for example, aluminum (Al) asp-type impurities. The p-type impurity concentration of the first low-concentration p barrier region 40a is, for example, equal to or greater than $5 \times 10^{16}$ cm$^{-3}$ and equal to or less than $1 \times 10^{18}$ cm$^{-3}$.

The depth of the first low-concentration p barrier region 40a is, for example, equal to or greater than 50 nm and equal to or less than 200 nm. In other words, the distance of the boundary between the n barrier region 34 and the first low-concentration p barrier region 40a from the first plane P1 is, for example, equal to or greater than 50 nm and equal to or less than 200 nm.

The second low-concentration p barrier region 40b is provided between the n barrier region 34 and the first plane P11. The second low-concentration p barrier region 40b is provided between the p barrier region 36 and a second body region 26b. The second low-concentration p barrier region 40b extends in the first direction.

The p-type impurity concentration of the second low-concentration p barrier region 40b is lower than the p-type impurity concentration of the p barrier region 36. The p-type impurity concentration of the second low-concentration p barrier region 40b is, for example, equal to or less than half of the p-type impurity concentration of the p barrier region 36.

The second low-concentration p barrier region 40b includes, for example, aluminum (Al) as p-type impurities. The p-type impurity concentration of the second low-concentration p barrier region 40b is, for example, equal to or greater than $5 \times 10^{16}$ cm$^{-3}$ and equal to or less than $1 \times 10^{18}$ cm$^{-3}$.

The depth of the second low-concentration p barrier region 40b is, for example, equal to or greater than 50 nm and equal to or less than 200 nm. In other words, the distance of the boundary between the n barrier region 34 and the second low-concentration p barrier region 40b from the first plane P1 is, for example, equal to or greater than 50 nm and equal to or less than 200 nm.

The source electrode 12 comes into contact with the first low-concentration p barrier region 40a and the second low-concentration p barrier region 40b. A silicide layer 12a comes into contact with the first low-concentration p barrier region 40a and the second low-concentration p barrier region 40b.

In the first low-concentration p barrier region 40a and the second low-concentration p barrier region 40b, the potential level of electrons is lower than that in the p barrier region 36. Therefore, in a portion in which the first low-concentration p barrier region 40a and the second low-concentration p barrier region 40b come into contact with the source electrode 12, a barrier with respect to electrons between the source electrode 12 and the n barrier region 34 is effectively lowered. As a result, the forward voltage (Vf) of the SBD in the MOSFET 200 according to the second embodiment is lower than that in the MOSFET 100 according to the first embodiment and the on-resistance of the SBD is reduced.

In a case in which the SBD of the MOSFET 200 is in an off state, the first low-concentration p barrier region 40a is covered with a depletion layer extending from the first body region 26a to the n barrier region 34 and the second low-concentration p barrier region 40b is covered with a depletion layer extending from the second body region 26b to the n barrier region 34. Therefore, an increase in reverse leakage current is suppressed.

As described above, according to the second embodiment, similarly to the first embodiment, a MOSFET with high reliability and a MOSFET with low on-resistance are achieved. Since the first low-concentration p barrier region 40a and the second low-concentration p barrier region 40b are provided, it is possible to reduce the on-resistance of the SBD embedded in the MOSFET.

Third Embodiment

A semiconductor device according to a third embodiment differs from the semiconductor device according to the first embodiment in that a silicon carbide layer includes a first-conductivity-type eighth silicon carbide region which is provided between the fifth silicon carbide region and the first plane and between the sixth silicon carbide region and the second silicon carbide region and comes into contact with the first electrode. Hereinafter, the description of a portion of the same content as that in the first embodiment will not be repeated.

Figure 8:
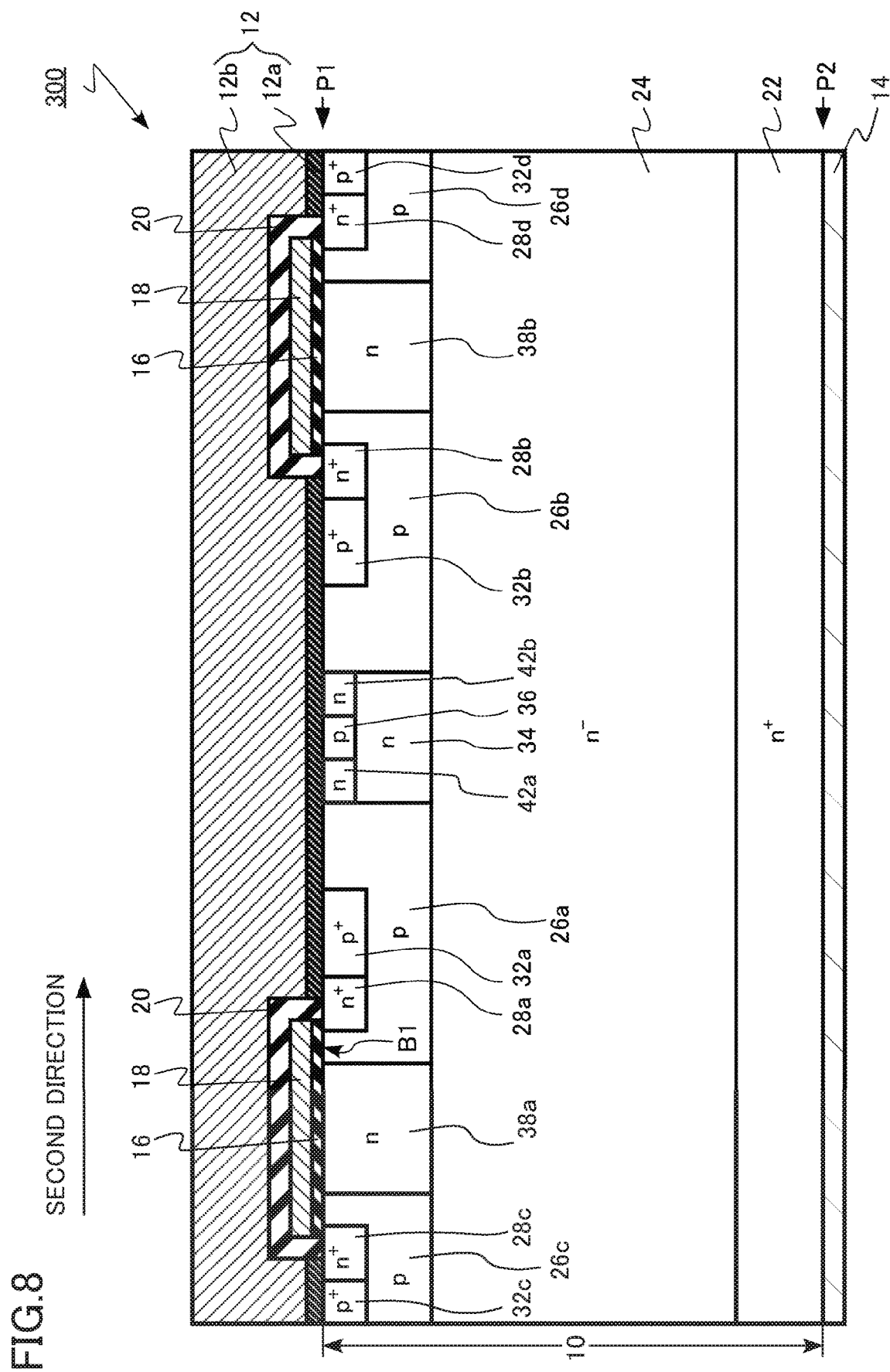
FIG. 8 is a cross-sectional view schematically illustrating a semiconductor device according to a third embodiment.

FIG. 8 is a cross-sectional view schematically illustrating the semiconductor device according to the third embodiment.

The semiconductor device according to the third embodiment is a planar-gate-type vertical MOSFET 300 using silicon carbide. The MOSFET 300 according to the third embodiment is, for example, a DIMOSFET in which a body region and a source region are formed by ion implantation. In addition, the semiconductor device according to the third embodiment includes an SBD as an embedded diode.

Hereinafter, a case in which the first conductivity type is an n type and the second conductivity type is a p type will be described as an example. The MOSFET 300 is a vertical n-channel MOSFET having electrons as carriers.

The MOSFET 300 includes a silicon carbide layer 10, a source electrode 12 (first electrode), a drain electrode 14 (second electrode), a gate insulating layer 16, a gate electrode 18, and an interlayer insulating layer 20.

The silicon carbide layer 10 includes a first low-concentration n-type n barrier region 42a (eighth silicon carbide region) and a second low-concentration n-type n barrier region 42b.

The first low-concentration n barrier region 42a is provided between the n barrier region 34 and the first plane P1. The first low-concentration n barrier region 42a is provided between the p barrier region 36 and the first body region 26a. The first low-concentration n barrier region 42a extends in the first direction.

The n-type impurity concentration of the first low-concentration n barrier region 42a is lower than the n-type impurity concentration of the n barrier region 34. The n-type impurity concentration of the first low-concentration n barrier region 42a is, for example, equal to or less than half of the n-type impurity concentration of the n barrier region 34.

The first low-concentration n barrier region 42a includes, for example, nitrogen (N) as n-type impurities. The n-type impurity concentration of the first low-concentration n barrier region 42a is, for example, equal to or greater than $2.5 \times 10^{16}$ cm$^{-3}$ and equal to or less than $1 \times 10^{17}$ cm$^{-3}$.

The second low-concentration n barrier region 42b is provided between the n barrier region 34 and the first plane P1. The second low-concentration n barrier region 42b is provided between the p barrier region 36 and the second body region 26b. The second low-concentration n barrier region 42b extends in the first direction.

The n-type impurity concentration of the second low-concentration n barrier region 42b is lower than the n-type impurity concentration of the n barrier region 34. The n-type impurity concentration of the second low-concentration n barrier region 42b is, for example, equal to or less than half of the n-type impurity concentration of the n barrier region 34.

The second low-concentration n barrier region 42b includes, for example, nitrogen (N) as n-type impurities. The n-type impurity concentration of the second low-concentration n barrier region 42b is, for example, equal to or greater than $2.5 \times 10^{16}$ cm$^{-3}$ and equal to or less than $1 \times 10^{17}$ cm$^{-3}$.

The source electrode 12 comes into contact with the first low-concentration n barrier region 42a and the second low-concentration n barrier region 42b. The silicide layer 12a comes into contact with the first low-concentration n barrier region 42a and the second low-concentration n barrier region 42b.

In a portion in which the first low-concentration n barrier region 42a and the second low-concentration n barrier region 42b come into contact with the source electrode 12, a barrier with respect to electrons between the source electrode 12 and the n barrier region 34 is low. As a result, the forward current-voltage characteristics of the SBD in the MOSFET 300 according to the third embodiment are linear characteristics. Therefore, the on-resistance of the SBD is reduced.

In a case in which the SBD of the MOSFET 300 is in an off state, the first low-concentration n barrier region 42a is covered with a depletion layer extending from the first body region 26a to the n barrier region 34 and the second low-concentration n barrier region 42b is covered with a depletion layer extending from the second body region 26b to the n barrier region 34. Therefore, an increase in reverse leakage current is suppressed.

As described above, according to the third embodiment, similarly to the first embodiment, a MOSFET with high reliability and a MOSFET with low on-resistance are achieved. Since the first low-concentration n barrier region 42a and the second low-concentration n barrier region 42b are provided, it is possible to reduce the on-resistance of the SBD embedded in the MOSFET.

Fourth Embodiment

A semiconductor device according to a fourth embodiment differs from the semiconductor device according to the second embodiment in that a silicon carbide layer includes a first-conductivity-type ninth silicon carbide region which is provided between the fifth silicon carbide region and the second silicon carbide region and has a higher first-conductivity-type impurity concentration than the fifth silicon carbide region. Hereinafter, the description of a portion of the same content as that in the first and second embodiments will not be repeated.

Figure 9:
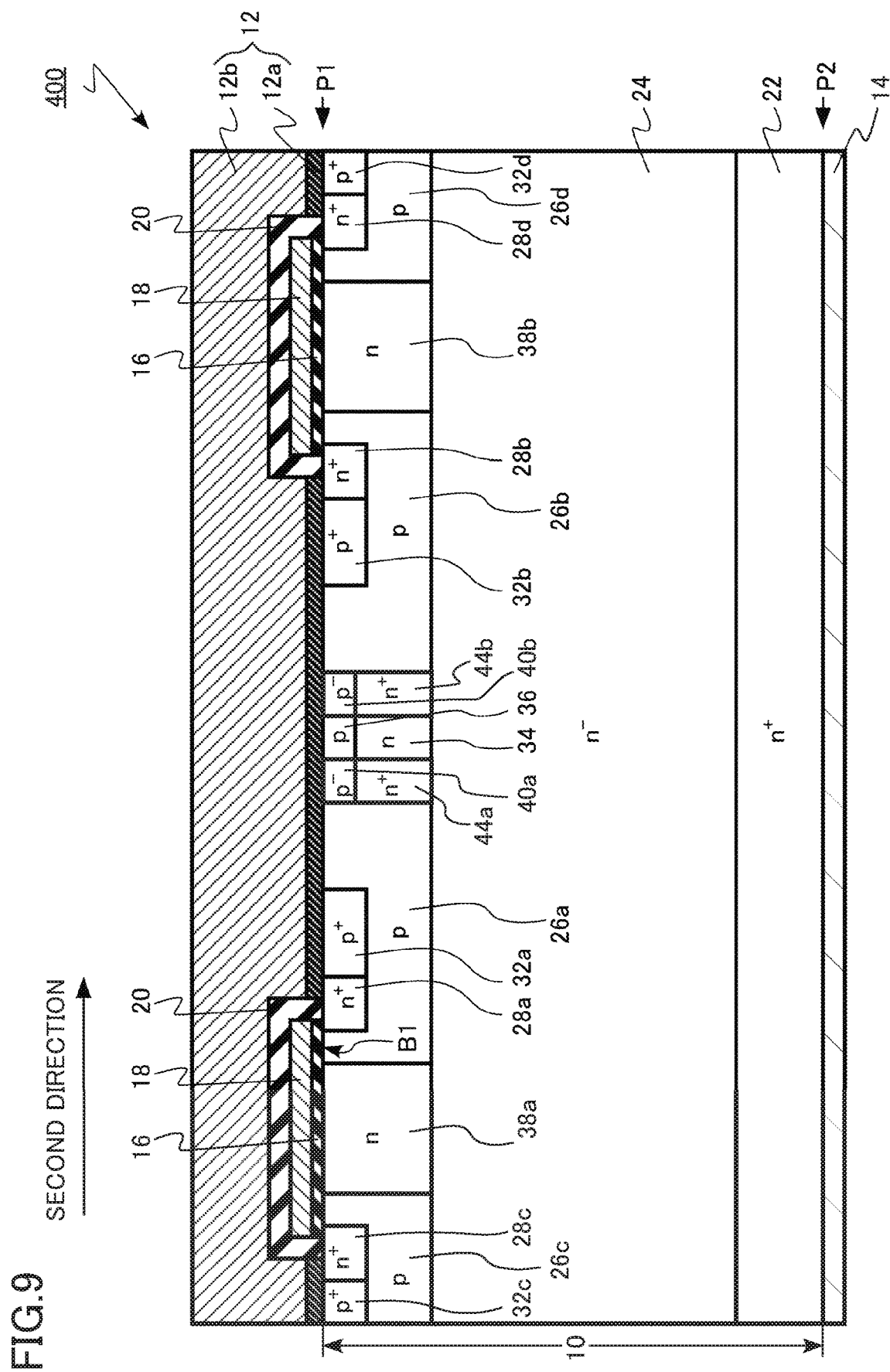
FIG. 9 is a cross-sectional view schematically illustrating a semiconductor device according to a fourth embodiment.

FIG. 9 is a cross-sectional view schematically illustrating the semiconductor device according to the fourth embodiment.

The semiconductor device according to the fourth embodiment is a planar-gate-type vertical MOSFET 400 using silicon carbide. The MOSFET 400 according to the fourth embodiment is, for example, a DIMOSFET in which a body region and a source region are formed by ion implantation. In addition, the semiconductor device according to the fourth embodiment includes an SBD as an embedded diode.

Hereinafter, a case in which the first conductivity type is an n type and the second conductivity type is a p type will be described as an example. The MOSFET 400 is a vertical n-channel MOSFET having electrons as carriers.

The MOSFET 400 includes a silicon carbide layer 10, a source electrode 12 (first electrode), a drain electrode 14 (second electrode), a gate insulating layer 16, a gate electrode 18, and an interlayer insulating layer 20.

The silicon carbide layer 10 includes a first low-concentration p barrier region 40a (seventh silicon carbide region), a second low-concentration p barrier region 40b, a first high-concentration n barrier region 44a (ninth silicon carbide region), and a second high-concentration n barrier region 44b.

The first high-concentration n barrier region 44a is provided between the n barrier region 34 and the first body region 26a. The first high-concentration n barrier region 44a extends in the first direction.

The n-type impurity concentration of the first high-concentration n barrier region 44a is higher than the n-type impurity concentration of the n barrier region 34. The n-type impurity concentration of the first high-concentration n barrier region 44a is, for example, equal to or greater than two times the n-type impurity concentration of the n barrier region 34.

The first high-concentration n barrier region 44a includes, for example, nitrogen (N) as n-type impurities. The n-type impurity concentration of the first high-concentration n barrier region 44a is, for example, equal to or greater than $1 \times 10^{17}$ cm$^{-3}$ and equal to or less than $4 \times 10^{17}$ cm$^{-3}$.

The second high-concentration n barrier region 44b is provided between the n barrier region 34 and the second body region 26b. The second high-concentration n barrier region 44b extends in the first direction.

The n-type impurity concentration of the second high-concentration n barrier region 44b is higher than the n-type impurity concentration of the n barrier region 34. The n-type impurity concentration of the second high-concentration n barrier region 44b is, for example, equal to or greater than two times the n-type impurity concentration of the n barrier region 34.

The second high-concentration n barrier region 44b includes, for example, nitrogen (N) as n-type impurities. The n-type impurity concentration of the second high-concentration n barrier region 44b is, for example, equal to or greater than $1 \times 10^{17}$ cm$^{-3}$ and equal to or less than $4 \times 10^{17}$ cm$^{-3}$.

The resistance of the first high-concentration n barrier region 44a and the second high-concentration n barrier region 44b is lower than the resistance of the n barrier region 34. Therefore, the on-resistance of the MOSFET 400 according to the fourth embodiment is reduced.

In particular, since the first high-concentration n barrier region 44a and the second high-concentration n barrier region 44b having low resistance are provided below the first low-concentration p barrier region 40a and the second low-concentration p barrier region 40b in which the forward voltage (Vf) is low, an on-current of the SBD flows easily and the on-resistance of the SBD is reduced.

As described above, according to the fourth embodiment, similarly to the first embodiment, a MOSFET with high reliability and a MOSFET with low on-resistance are achieved. Since the first high-concentration n barrier region 44a and the second high-concentration n barrier region 44b are provided, it is possible to reduce the on-resistance of the SBD embedded in the MOSFET.

Fifth Embodiment

A semiconductor device according to a fifth embodiment differs from the semiconductor device according to the first embodiment in that a trench is provided in a silicon carbide layer and a gate electrode is provided in the trench. Hereinafter, the description of a portion of the same content as that in the first embodiment will not be repeated.

Figure 10:
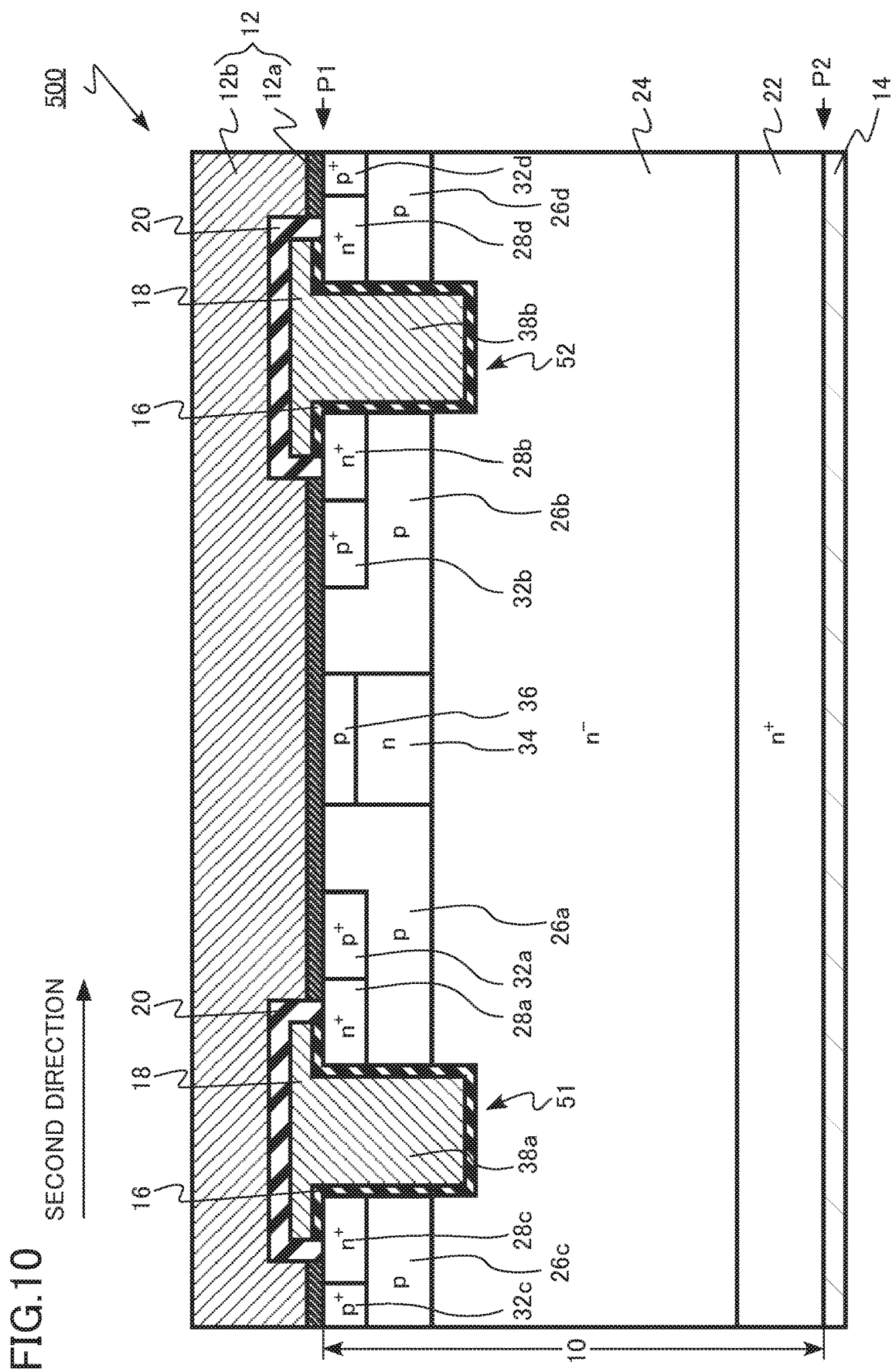
FIG. 10 is a cross-sectional view schematically illustrating a semiconductor device according to a fifth embodiment.

FIG. 10 is a cross-sectional view schematically illustrating the semiconductor device according to the fifth embodiment.

The semiconductor device according to the fifth embodiment is a trench-gate-type vertical MOSFET 500 using silicon carbide. The semiconductor device according to the fifth embodiment includes an SBD as an embedded diode.

Hereinafter, a case in which the first conductivity type is an n type and the second conductivity type is a p type will be described as an example. The MOSFET 500 is a vertical n-channel MOSFET having electrons as carriers.

The MOSFET 500 includes a silicon carbide layer 10, a source electrode 12 (first electrode), a drain electrode 14 (second electrode), a gate insulating layer 16, a gate electrode 18, an interlayer insulating layer 20, a first trench 51, and a second trench 52.

The silicon carbide layer 10 includes an n$^+$ drain region 22, an n$^-$ drift region 24 (first silicon carbide region), a p-type first body region 26a (second silicon carbide region), a p-type second body region 26b (third silicon carbide region), a p-type third body region 26c, a p-type fourth body region 26d, an n$^+$ first source region 28a (fourth silicon carbide region), an n$^+$ second source region 28b, an n$^+$ third source region 28c, an n$^+$ fourth source region 28d, a p$^+$ first body contact region 32a (tenth silicon carbide region), a p$^+$ second body contact region 32b, a p third body contact region 32c, a p$^+$ fourth body contact region 32d, an n barrier region 34 (fifth silicon carbide region), a p barrier region 36 (sixth silicon carbide region), an n-type first JFET region 38a, and an n-type second JFET region 38b.

The first trench 51 and the second trench 52 are provided in the silicon carbide layer 10. The first trench 51 and the second trench 52 extend in the first direction.

The gate electrode 18 is provided in the first trench 51 and the second trench 52.

As described above, according to the fifth embodiment, similarly to the first embodiment, a MOSFET with high reliability and a MOSFET with low on-resistance are achieved. Since the MOSFET has the trench gate structure, it is possible to further reduce the on-resistance of the MOSFET.

In the first to fifth embodiments, the case in which 4H-SiC is used as the crystal structure of SiC has been described as an example. However, the embodiments of the invention can be applied to devices using SiC with other crystal structures such as 6H-SiC and 3C-SiC. In addition, faces other than the (0001) face may be applied to the front surface of the silicon carbide layer 10.

In the first to fifth embodiments, the case in which the first conductivity type is the n type and the second conductivity type is the p type has been described as an example. However, the first conductivity type may be a p type and the second conductivity type may be an n type.

In the first to fifth embodiments, aluminum (Al) is given as an example of the p-type impurities. However, boron (B) may be used. In addition, nitrogen (N) and phosphorus (P) are given as an example of the n-type impurities. However, for example, arsenic (As) and antimony (Sb) may be applied.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a second electrode;
a silicon carbide layer provided between the first electrode and the second electrode, the silicon carbide layer having a first plane on a first electrode side and a second plane on a second electrode side, the silicon carbide layer including first silicon carbide region of first-conductivity-type, a second silicon carbide region of second-conductivity-type, a third silicon carbide region of second-conductivity-type, a fourth silicon carbide region of first-conductivity-type, a fifth silicon carbide region of first-conductivity-type, and a sixth silicon carbide region of second-conductivity-type, the second silicon carbide region being provided between the first silicon carbide region and the first plane, the third silicon carbide region being provided between the first silicon carbide region and the first plane, the third silicon carbide region being separated from the second silicon carbide region, the fourth silicon carbide region being provided between the second silicon carbide region and the first plane, the fourth silicon carbide region contacting the first electrode, the fifth silicon carbide region being provided between the second silicon carbide region and the third silicon carbide region, the fifth silicon carbide region having a higher first-conductivity-type impurity concentration than the first silicon carbide region, the sixth silicon carbide region being provided between the fifth silicon carbide region and the first plane, the sixth silicon carbide region contacting the first electrode;
a gate electrode facing the second silicon carbide region; and
a gate insulating layer provided between the gate electrode and the second silicon carbide region.

2. The semiconductor device according to claim 1, wherein the silicon carbide layer includes a seventh silicon carbide region of second-conductivity-type provided between the fifth silicon carbide region and the first plane and between the sixth silicon carbide region and the second silicon carbide region, the seventh silicon carbide region contacting the first electrode, the seventh silicon carbide region having a lower second-conductivity-type impurity concentration than the sixth silicon carbide region.

3. The semiconductor device according to claim 1, wherein the silicon carbide layer includes a eighth silicon carbide region of first-conductivity-type provided between the fifth silicon carbide region and the first plane and between the sixth silicon carbide region and the second silicon carbide region, the eighth silicon carbide region contacting the first electrode.

4. The semiconductor device according to claim 1, wherein a first portion of the first electrode contacting the fourth silicon carbide region and a second portion of the first electrode contacting the sixth silicon carbide region are made of the same material.

5. The semiconductor device according to claim 1, wherein a second-conductivity-type impurity concentration of the sixth silicon carbide region is higher than a second-conductivity-type impurity concentration of a portion of the second silicon carbide region facing the gate electrode.

6. The semiconductor device according to claim 1, wherein a distance of a boundary between the fifth silicon carbide region and the sixth silicon carbide region from the first plane is equal to or greater than 50 nm and equal to or less than 200 nm.

7. The semiconductor device according to claim 1, wherein the silicon carbide layer includes a ninth silicon carbide region of first-conductivity-type provided between the fifth silicon carbide region and the second silicon carbide region, the ninth silicon carbide region having a higher first-conductivity-type impurity concentration than the fifth silicon carbide region.

8. The semiconductor device according to claim 1, wherein the silicon carbide layer includes a tenth silicon carbide region of second-conductivity-type provided between the second silicon carbide region and the first plane, the tenth silicon carbide region contacting the first electrode, the tenth silicon carbide region having a higher second-conductivity-type impurity concentration than the second silicon carbide region.

9. The semiconductor device according to claim 1, wherein a portion of the second silicon carbide region contacting the first plane and faces the gate electrode.

10. The semiconductor device according to claim 1, wherein the silicon carbide layer has a trench and the gate electrode is provided in the trench.

11. The semiconductor device according to claim 2, wherein a first portion of the first electrode coming into contact with the fourth silicon carbide region and a second portion of the first electrode contacting the sixth silicon carbide region are made of same material.

12. The semiconductor device according to claim 2, wherein the second-conductivity-type impurity concentration of the sixth silicon carbide region is higher than a second-conductivity-type impurity concentration of a portion of the second silicon carbide region facing the gate electrode.

13. The semiconductor device according to claim 3,
wherein a first portion of the first electrode contacting the fourth silicon carbide region and a second portion of the first electrode contacting the sixth silicon carbide region are made of same material.

14. The semiconductor device according to claim 3,
wherein a second-conductivity-type impurity concentration of the sixth silicon carbide region is higher than a second-conductivity-type impurity concentration of a portion of the second silicon carbide region facing the gate electrode.

* * * * *